(12) United States Patent
Lin et al.

(10) Patent No.: US 10,595,395 B2
(45) Date of Patent: Mar. 17, 2020

(54) CIRCUIT LAYOUT STRUCTURE COMPRISING A SINGLE-ENDED SIGNAL TRANSMISSION LINE DISPOSED BETWEEN FIRST AND SECOND DIFFERENTIAL SIGNAL TRANSMISSION LINE PAIRS

(71) Applicant: ASUSTEK COMPUTER INC., Taipei (TW)

(72) Inventors: Hank Lin, Taipei (TW); Bin-Chyi Tseng, Taipei (TW); Tsung-Chieh Yen, Taipei (TW)

(73) Assignee: Asustek Computer Inc., Taipei (TW)

( * ) Notice: Subject to any disclaimer, the term of this patent is extended or adjusted under 35 U.S.C. 154(b) by 54 days.

(21) Appl. No.: 15/889,694

(22) Filed: Feb. 6, 2018

(65) Prior Publication Data

US 2018/0235079 A1 Aug. 16, 2018

(30) Foreign Application Priority Data

Feb. 10, 2017 (TW) .............................. 106104448 A

(51) Int. Cl.
*H05K 1/02* (2006.01)

(52) U.S. Cl.
CPC ......... *H05K 1/0245* (2013.01); *H05K 1/0228* (2013.01); *H05K 2201/09236* (2013.01)

(58) Field of Classification Search
CPC .................................................. H05K 1/0245
USPC ............................................................. 333/5
See application file for complete search history.

(56) References Cited

U.S. PATENT DOCUMENTS

| 2002/0017963 | A1* | 2/2002 | Shimamoto et al. ..... H01P 3/08 333/1 |
| 2012/0020416 | A1* | 1/2012 | Shimura et al. ..... H01B 7/0838 375/257 |
| 2014/0140186 | A1 | 5/2014 | Lin |
| 2017/0303391 | A1* | 10/2017 | Miyasaka ............ H05K 1/0228 |

FOREIGN PATENT DOCUMENTS

| CN | 103841748 A | 6/2014 |
| CN | 105307383 A | 2/2016 |

* cited by examiner

*Primary Examiner* — Benny T Lee
(74) *Attorney, Agent, or Firm* — Muncy, Geissler, Olds & Lowe, P.C.

(57) ABSTRACT

A circuit layout structure is provided. In the circuit layout structure, a transmission line group is disposed on a substrate. In its first differential signal transmission line pair, a first negative polarity transmission line is parallel to a first positive polarity transmission line and is configured to transmit a first negative polarity transmission signal of a first differential signal. In a second differential signal transmission line pair, a second positive polarity transmission line is parallel to a single-ended signal transmission line and is configured to transmit a second positive polarity transmission signal of a second differential signal. The second negative polarity transmission line is parallel to the second positive polarity transmission line. The single-ended signal transmission line is disposed between the first differential signal transmission line pair and the second differential signal transmission line pair.

11 Claims, 4 Drawing Sheets

CIRCUIT LAYOUT STRUCTURE COMPRISING A SINGLE-ENDED SIGNAL TRANSMISSION LINE DISPOSED BETWEEN FIRST AND SECOND DIFFERENTIAL SIGNAL TRANSMISSION LINE PAIRS

CROSS-REFERENCE TO RELATED APPLICATION

This application claims the priority benefit of TW application serial No. 106104448, filed on Feb. 10, 2017. The entirety of the above-mentioned patent application is hereby incorporated by references herein and made a part of specification.

BACKGROUND OF THE INVENTION

Field of the Invention

The disclosure relates to a circuit layout structure.

Description of the Related Art

With the development of technology, high frequency electronic devices transmit digital signals at a high transmission speed. However, with the improvement of the transmission speed, signal quality and integrity are consideration factors, such as Electromagnetic Compatibility (EMC), Electromagnetic Interference (EMI), Power Integrity (PI) and Signal Integrity (SI) in the design of a circuit.

SUMMARY OF THE INVENTION

According to an aspect of the disclosure, a circuit layout structure is provided. The circuit layout structure comprises: a substrate; and a transmission line group, disposed on the substrate and including: a first differential signal transmission line pair, configured to transmit a first differential signal and including: a first positive polarity transmission line; and a first negative polarity transmission line, parallel to the first positive polarity transmission line, and configured to transmit a first negative polarity transmission signal of the first differential signal; a second differential signal transmission line pair, configured to transmit a second differential signal and including: a second positive polarity transmission line, configured to transmit a second positive polarity transmission signal of the second differential signal; and a second negative polarity transmission line, parallel to the second positive polarity transmission line; and a single-ended signal transmission line, parallelly disposed between the first differential signal transmission line pair and the second differential signal transmission line pair, and configured to transmit a circuit signal; wherein the single-ended signal transmission line are adjacent to the first negative polarity transmission line and the second positive polarity transmission line respectively, and a first noise interference on the circuit signal formed by the first negative polarity transmission signal and a second noise interference on the circuit signal formed by the second positive polarity transmission signal weaken each other.

DETAILED DESCRIPTION OF THE EMBODIMENTS

Figure 1:
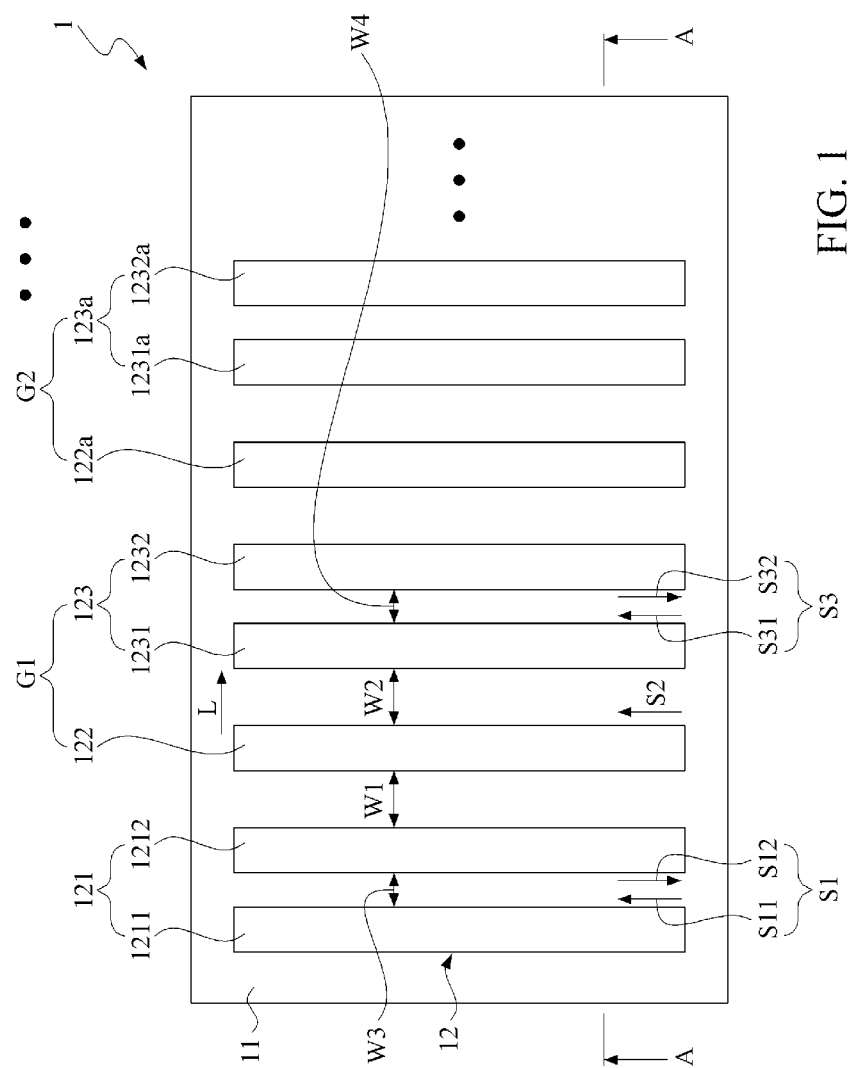
FIG. 1 is a schematic view of a circuit layout structure in a first embodiment.

These and other features, aspects, and advantages of the present invention will become better understood with regard to the following description, appended claims, and accompanying drawings, where like features in the drawings are denoted by the same reference numbers. However, the invention is not limited to the embodiments.

Figure 2:
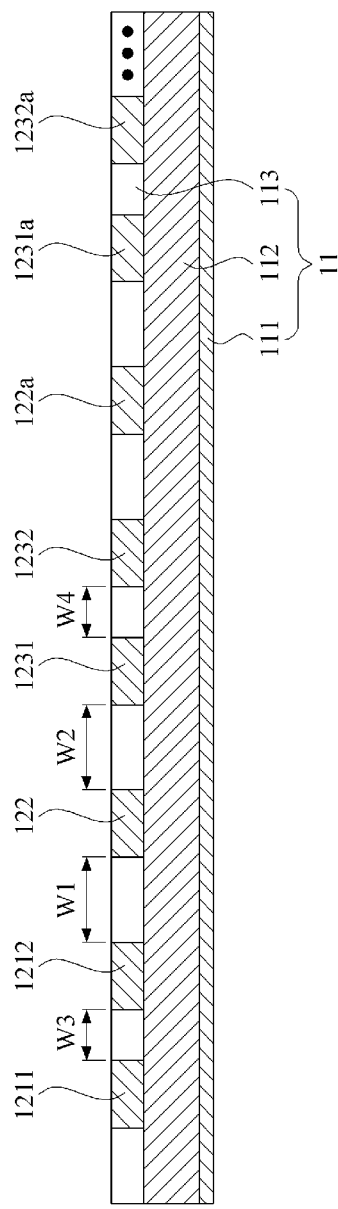
FIG. 2 is an A-A sectional view of FIG. 1 with a circuit layout structure in a first embodiment.

Please refer to FIG. 1 and FIG. 2. In an embodiment, a circuit layout structure 1 (FIG. 1) includes a substrate 11 and a transmission line group 12. In an embodiment, the substrate 11 is a Printed Circuit Board (PCB) or a chip. The substrate 11 includes a first substrate layer 111, a first dielectric layer 112 and a transmission line layout layer 113 stacked sequentially as shown in FIG. 2. Materials and thicknesses of first substrate layer 111 and the first dielectric layer 112 can be designed according to a practical requirement, which is not limited here.

The transmission line group 12 (FIG. 1) is disposed on the transmission line layout layer 113 of the substrate 11. The transmission line group 12 includes a first differential signal transmission line pair 121, a single-ended signal transmission line 122 and a second differential signal transmission line pair 123 as shown in FIG. 1.

The first differential signal transmission line pair 121 includes a first positive polarity transmission line 1211 and a first negative polarity transmission line 1212. The first negative polarity transmission line 1212 is parallel to the first positive polarity transmission line 1211. A third distance W3 is formed between the first negative polarity transmission line 1212 and the first positive polarity transmission line 1211.

The single-ended signal transmission line 122 is parallel to the first positive polarity transmission line 1211 and the first negative polarity transmission line 1212. A first distance W1 is formed between the single-ended signal transmission line 122 and the first negative polarity transmission line 1212.

The second differential signal transmission line pair 123 includes a second positive polarity transmission line 1231 and a second negative polarity transmission line 1232. The second positive polarity transmission line 1231 is parallel to the single-ended signal transmission line 122. A second distance W2 is formed between the second positive polarity transmission line 1231 and the single-ended signal transmission line 122. The second distance W2 is equal to the first distance W1.

The second negative polarity transmission line 1232 is parallel to the second positive polarity transmission line 1231. A fourth distance W4 is formed between the second negative polarity transmission line 1232 and the second positive polarity transmission line 1231. The fourth distance W4 is equal to the third distance W3. In the first embodiment, the third distance W3 and the fourth distance W4) are smaller than the first distance W1 and the second distance W2).

The first positive polarity transmission line 1211, the first negative polarity transmission line 1212, the single-ended signal transmission line 122, the second positive polarity transmission line 1231 and the second negative polarity transmission line 1232 are sequentially disposed on the transmission line layout layer 113 of the substrate 11 along an arrangement direction L (such as an X axis direction, which is not limited herein as shown in FIG. 1). That is to say, the single-ended signal transmission line 122 is adjacent to the first negative polarity transmission line 1212 and the second positive polarity transmission line 1231 respectively.

A line group G1 (FIG. 1) includes the single-ended signal transmission line 122 and the second differential signal transmission line pair 123. The transmission line group 12 further includes a single-ended signal transmission line 122a and a second differential signal transmission line pair 123a (FIG. 1) with a second positive polarity transmission line 1231a and a second negative polarity transmission line 1232a. A line group G2 (FIG. 1) includes the single-ended signal transmission line 122a and the second differential signal transmission line pair 123a. That is to say, the line groups G1 and G2 are disposed on the substrate 11 along the arrangement direction L. In the embodiment, two line groups G1 and G2 are shown. However, the number of line groups are disposed on the substrate 11 along the arrangement direction L is not limited herein.

As shown in FIG. 1, in an embodiment, the ends at the lower parts of the first differential signal transmission line pair 121, the single-ended signal transmission line 122 and second differential signal transmission line pair 123 are input ends, and the ends at upper parts of the first differential signal transmission line pair 121, the single-ended signal transmission line 122 and second differential signal transmission line pair 123 are output ends.

The first differential signal transmission line pair 121 is configured to transmit a first differential signal S1. Furthermore, the first positive polarity transmission line 1211 is configured to transmit a first positive polarity transmission signal S11 of the first differential signal S1. The first negative polarity transmission line 1212 is configured to transmit a first negative polarity transmission signal S12 of the first differential signal S1. In the embodiment as shown in FIG. 1, the direction of the first positive polarity transmission signal S11 and that of the first negative polarity transmission signal S12 are the current flow direction, which is not limited herein.

The single-ended signal transmission line 122 is configured to transmit a circuit signal S2. The circuit signal S2 is known for persons skilled in the prior art, which is not described herein. The second differential signal transmission line pair 123 is configured to transmit a second differential signal S3. Furthermore, the second positive polarity transmission line 1231 is configured to transmit a second positive polarity transmission signal S31 of the second differential signal S3. The second negative polarity transmission line 1232 is configured to transmit a second negative polarity transmission signal S32 of the second differential signal S3. Similarly, the direction of the second positive polarity transmission signal S31 and that of the second negative polarity transmission signal S32 are the current flow direction, which is not limited herein.

When the first differential signal transmission line pair 121 transmits the first differential signal S1 and the second differential signal transmission line pair 123 transmits the second differential signal S3, a first noise interference on the circuit signal S2 formed by the first negative polarity transmission signal S12 and a second noise interference on the circuit signal S2 formed by the second positive polarity transmission signal S31 weaken each other.

When the first differential signal transmission line pair 121, the single-ended signal transmission line 122 and the second differential signal transmission line pair 123 are straight lines, and the first distance W1 is equal to the second distance W2, the first noise interference and the second noise interference weaken each other to zero. Therefore, even when the first differential signal transmission line pair 121, the single-ended signal transmission line 122 and the second differential signal transmission line pair 123 are bent, the first noise interference and the second noise interference are also weakened. For example, when the first distance W1 and the second distance W2 are equal, and the bending of the first differential signal transmission line pair 121 and that of the second differential signal transmission line pair 123 are symmetrical, the first noise interference and the second noise interference weaken each other completely.

Figure 3:
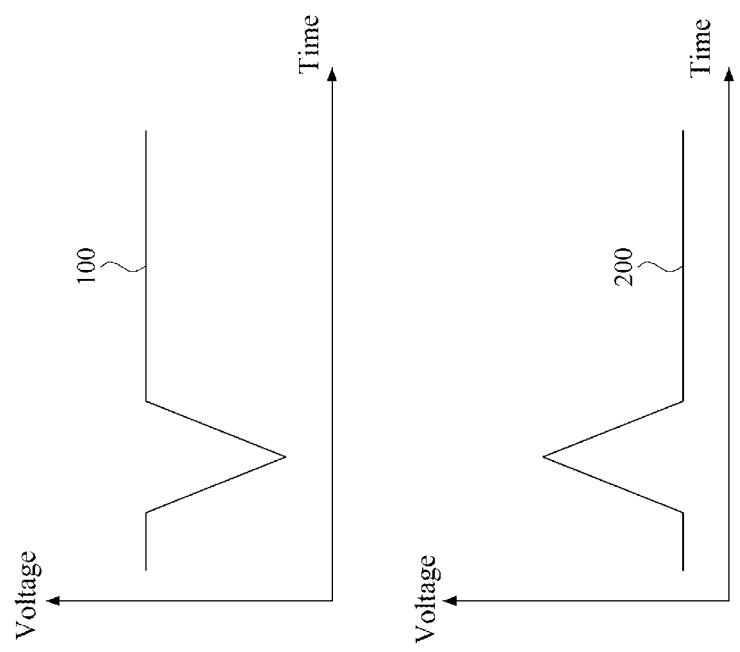
FIG. 3 shows Voltage-to-Time waveforms of a first noise interference and a second noise interference in a first embodiment.

Please refer to FIG. 3, in an embodiment, a waveform 100 of the first noise interference and a waveform 200 of the second noise interference weaken each other. The waveform 100 and the waveform 200 shown in FIG. 3 is just an example, and practical waveforms of the noise interferences are not limited herein.

Figure 4:
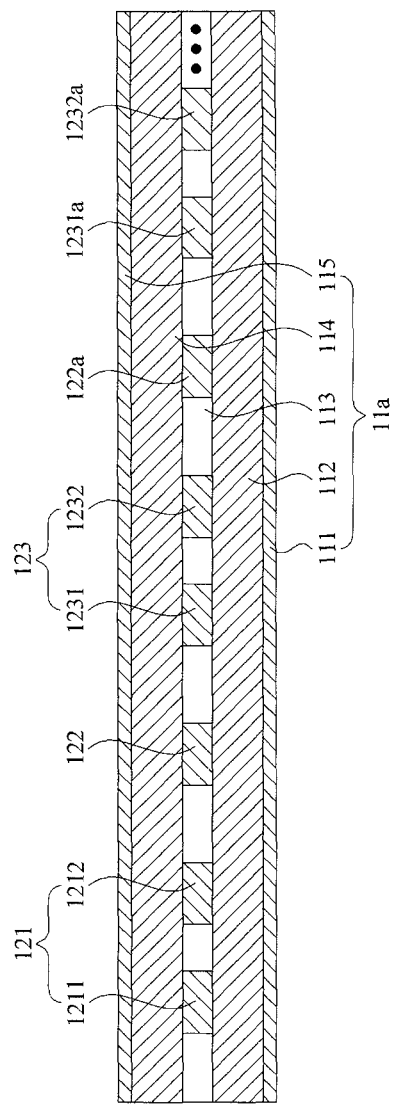
FIG. 4 is a sectional view of a circuit layout structure in a second embodiment.

Please refer to FIG. 4. Besides the first substrate layer 111, the first dielectric layer 112 and the transmission line layout layer 113, a substrate 11a further includes a second dielectric layer 114 and a second substrate layer 115. The second dielectric layer 114 and second substrate layer 115 are stacked on the transmission line layout layer 113 sequentially (similarly, materials and thicknesses are designed according to a practical requirement). The first differential signal transmission line pair 121, the single-ended signal transmission line 122 and the second differential signal transmission line pair 123 are covered by the second dielectric layer 114 and second substrate layer 115. Therefore, the first substrate layer 111, the first dielectric layer 112, the transmission line layout layer 113, the second dielectric layer 114 and the second substrate layer 115 are stacked sequentially. The structures of the first substrate layer 111, the first dielectric layer 112, the transmission line layout layer 113, the first differential signal transmission line pair 121, the single-ended signal transmission line 122 and the second differential signal transmission line pair 123 are the same as those in the first embodiment, which is not described herein.

In sum, in the circuit layout structure in embodiments, a first positive polarity transmission line, a first negative polarity transmission line, a single-ended signal transmission line, a second positive polarity transmission line and a second negative polarity transmission line are sequentially disposed on a substrate along an arrangement direction. Since the first noise interference on the circuit signal formed by the first negative polarity transmission signal and a second noise interference on the circuit signal formed by the second positive polarity transmission signal weaken each other, the crosstalk is decreased and an area for a ground protective line is omitted. Therefore, it is beneficial to lighten and minimize electronic devices.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A circuit layout structure, comprising:
a substrate, including a first substrate layer, a first dielectric layer and a transmission line layout layer stacked sequentially; and
a transmission line group, disposed on the transmission line layout layer and including:
a first differential signal transmission line pair, configured to transmit a first differential signal and including:
a first positive polarity transmission line; and
a first negative polarity transmission line, parallel to the first positive polarity transmission line, and configured to transmit a first negative polarity transmission signal of the first differential signal;
a second differential signal transmission line pair, configured to transmit a second differential signal and including:
a second positive polarity transmission line, configured to transmit a second positive polarity transmission signal of the second differential signal; and
a second negative polarity transmission line, parallel to the second positive polarity transmission line; and
a single-ended signal transmission line, parallelly disposed between the first differential signal transmission line pair and the second differential signal transmission line pair, and configured to transmit a circuit signal;
wherein the single-ended signal transmission line is adjacent to the first negative polarity transmission line and the second positive polarity transmission line respectively, a first noise interference is formed on the circuit signal by the first negative polarity transmission signal, a second noise interference is formed on the circuit signal by the second positive polarity transmission signal, and the first noise interference on the circuit signal and the second noise interference on the circuit signal weaken each other.

2. The circuit layout structure according to claim 1, wherein the substrate is a Printed Circuit Board (PCB) or a chip.

3. The circuit layout structure according to claim 1, wherein the substrate further comprises a second dielectric layer and a second substrate layer, and the second dielectric layer and the second substrate layer are sequentially stacked on the transmission line layout layer.

4. The circuit layout structure according to claim 1, wherein a first distance is formed between the first negative polarity transmission line and the single-ended signal transmission line, and a second distance is formed between the second positive polarity transmission line and the single-ended signal transmission line, and the first distance is equal to the second distance.

5. The circuit layout structure according to claim 4, wherein a third distance is formed between the first positive polarity transmission line and the first negative polarity transmission line, and the third distance is smaller than the first distance and the second distance.

6. The circuit layout structure according to claim 5, wherein a fourth distance is formed between the second positive polarity transmission line and the second negative polarity transmission line, the fourth distance is smaller than the first distance and the second distance and is equal to the third distance.

7. A circuit layout structure, comprising:
a substrate; and
a transmission line group, disposed on the substrate and including:
a first differential signal transmission line pair, configured to transmit a first differential signal and including:
a first positive polarity transmission line; and
a first negative polarity transmission line, parallel to the first positive polarity transmission line, and configured to transmit a first negative polarity transmission signal of the first differential signal;
a second differential signal transmission line pair, configured to transmit a second differential signal and including:
a second positive polarity transmission line, configured to transmit a second positive polarity transmission signal of the second differential signal; and
a second negative polarity transmission line, parallel to the second positive polarity transmission line; and
a single-ended signal transmission line, parallelly disposed between the first differential signal transmission line pair and the second differential signal transmission line pair, and configured to transmit a circuit signal;
wherein a first distance is formed between the first negative polarity transmission line and the single-ended signal transmission line, a second distance is formed between the second positive polarity transmission line and the single-ended signal transmission line, a third distance is formed between the first positive polarity transmission line and the first negative polarity transmission line, the first distance is equal to the second distance, and the third distance is smaller than the first distance and the second distance;
wherein the single-ended signal transmission line is adjacent to the first negative polarity transmission line and the second positive polarity transmission line respectively, a first noise interference is formed on the circuit signal by the first negative polarity transmission signal, a second noise interference is formed on the circuit signal by the second positive polarity transmission signal, and the first noise interference on the circuit signal and the second noise interference on the circuit signal weaken each other.

8. The circuit layout structure according to claim 7, wherein a fourth distance is formed between the second positive polarity transmission line and the second negative polarity transmission line, the fourth distance is smaller than the first distance and the second distance and is equal to the third distance.

9. The circuit layout structure according to claim 7, wherein the substrate is a Printed Circuit Board (PCB) or a chip.

10. The circuit layout structure according to claim 7, wherein the substrate comprises a first substrate layer, a first dielectric layer and a transmission line layout layer stacked sequentially, and the transmission line group is disposed on the transmission line layout layer.

11. The circuit layout structure according to claim 10, wherein the substrate further comprises a second dielectric layer and a second substrate layer, and the second dielectric layer and the second substrate layer are sequentially stacked on the transmission line layout layer.

* * * * *